United States Patent
Banhegyesi

(10) Patent No.: US 8,489,346 B2
(45) Date of Patent: Jul. 16, 2013

(54) PARAMETRIC MULTI-CYCLE AVERAGING IN AN INTELLIGENT ELECTRONIC DEVICE

(75) Inventor: Tibor Banhegyesi, Baldwin, NY (US)

(73) Assignee: Electro Industries/Gauge Tech, Westbury, NY (US)

(*) Notice: Subject to any disclaimer, the term of this patent is extended or adjusted under 35 U.S.C. 154(b) by 0 days.

(21) Appl. No.: 13/571,927

(22) Filed: Aug. 10, 2012

(65) Prior Publication Data

US 2012/0303299 A1    Nov. 29, 2012

Related U.S. Application Data

(63) Continuation of application No. 13/080,025, filed on Apr. 5, 2011, now Pat. No. 8,244,489, which is a continuation of application No. 12/055,503, filed on Mar. 26, 2008, now Pat. No. 7,920,976.

(60) Provisional application No. 60/920,198, filed on Mar. 27, 2007.

(51) Int. Cl.
    *G01R 21/00* (2006.01)
(52) U.S. Cl.
    USPC ............. 702/60; 702/58; 702/61; 702/62; 702/64; 702/72; 700/293; 323/209; 324/74; 324/115; 324/120
(58) Field of Classification Search
    USPC ............ 702/57, 62, 61, 60, 58, 64, 72, 66, 702/85, 65; 700/293; 323/205, 208, 209, 323/266, 210; 324/115, 120, 103, 601, 130, 324/74
    See application file for complete search history.

(56) References Cited

U.S. PATENT DOCUMENTS

| | | | |
|---|---|---|---|
| 4,246,623 A | 1/1981 | Sun | |
| 4,466,071 A | 8/1984 | Russell | |
| 5,014,229 A | 5/1991 | Mofachern | |
| 5,212,441 A | 5/1993 | McEachern et al. | |
| 5,224,054 A | 6/1993 | Wallis | |
| 5,233,538 A | 8/1993 | Wallis | |
| 5,237,511 A | 8/1993 | Caird et al. | |
| 5,298,854 A | 3/1994 | McEachern et al. | |
| 5,298,855 A | 3/1994 | McEachern et al. | |
| 5,298,856 A | 3/1994 | McEachern et al. | |
| 5,298,859 A | 3/1994 | McEachern et al. | |
| 5,298,885 A | 3/1994 | McEachern et al. | |
| 5,298,888 A | 3/1994 | McEachern et al. | |
| 5,300,924 A | 4/1994 | McEachern et al. | |
| 5,302,890 A | 4/1994 | McEachern et al. | |
| 5,307,009 A | 4/1994 | McEachern et al. | |
| 5,315,527 A | 5/1994 | Beckwith | |
| 5,347,464 A | 9/1994 | McEachern et al. | |
| 5,544,064 A | 8/1996 | Beckwith | |
| 5,548,527 A * | 8/1996 | Hemminger et al. | 702/62 |

(Continued)

*Primary Examiner* — Carol Tsai
(74) *Attorney, Agent, or Firm* — Gerald E. Hespos; Michael J. Porco; Matthew T. Hespos

(57) ABSTRACT

A method and apparatus measures electrical power usage and quality, while mitigating the effects of noise on measured signals or parameters. Specifically, a digital electrical power and energy meter employs a method in which a processor averages a parameter, such as voltage or current, over a plurality of cycles of a time-varying signal, such as an AC electrical signal. The method employed by the meter samples a parameter over the plurality of cycles and computes the average of the samples corresponding to the same phase angle of the signal to produce an average signal.

20 Claims, 6 Drawing Sheets

U.S. PATENT DOCUMENTS

| | | | |
|---|---|---|---|
| 5,559,719 A | 9/1996 | Johnson et al. | |
| 5,581,173 A | 12/1996 | Yalla et al. | |
| 5,706,214 A * | 1/1998 | Putt et al. | 700/286 |
| 5,745,114 A * | 4/1998 | King et al. | 715/810 |
| 5,774,366 A | 6/1998 | Beckwith | |
| 5,822,165 A | 10/1998 | Moran | |
| 6,084,394 A * | 7/2000 | Windsheimer et al. | 324/130 |
| 6,519,537 B1 * | 2/2003 | Yang | 702/58 |
| 6,717,394 B2 * | 4/2004 | Elms | 324/76.39 |
| 6,748,344 B2 * | 6/2004 | Mendoza et al. | 702/189 |
| 7,336,201 B2 * | 2/2008 | Green et al. | 340/870.02 |
| 7,436,687 B2 * | 10/2008 | Patel | 363/142 |
| 7,511,468 B2 | 3/2009 | McEachern et al. | |
| 7,514,907 B2 | 4/2009 | Rajda et al. | |
| 7,920,976 B2 | 4/2011 | Banhegyesi | |
| 8,078,418 B2 * | 12/2011 | Banhegyesi et al. | 702/64 |
| 8,244,489 B2 | 8/2012 | Banhegyesi | |
| 2003/0178982 A1 * | 9/2003 | Elms | 324/76.38 |
| 2003/0204339 A1 * | 10/2003 | Mendoza et al. | 702/57 |
| 2006/0028354 A1 * | 2/2006 | Green et al. | 340/870.02 |
| 2006/0267560 A1 * | 11/2006 | Rajda et al. | 323/209 |
| 2008/0143554 A1 * | 6/2008 | Green et al. | 340/870.02 |
| 2008/0172192 A1 | 7/2008 | Banhegyesi | |
| 2008/0234957 A1 | 9/2008 | Banhegyesi et al. | |
| 2008/0238406 A1 | 10/2008 | Banhegyesi | |
| 2008/0238713 A1 | 10/2008 | Banhegyesi et al. | |

* cited by examiner

PARAMETRIC MULTI-CYCLE AVERAGING IN AN INTELLIGENT ELECTRONIC DEVICE

CROSS-REFERENCE TO RELATED PATENTS AND PATENT APPLICATIONS

This application is a continuation of U.S. Ser. No. 13/080,025, filed on Apr. 5, 2011, which is a continuation of U.S. Ser. No. 12/055,503, filed on Mar. 26, 2008, now U.S. Pat. No. 7,920,976, which claims priority to U.S. Provisional Patent Application No. 60/920,198, filed on Mar. 27, 2007, the contents of all of which are hereby incorporated by reference in their entireties.

FIELD

The present patent relates generally to the field of intelligent electronic devices for electrical utility services and, more specifically, to digital electrical power and energy meters for use in performing electrical utility services.

BACKGROUND

Producers, suppliers, and consumers of electrical power rely on energy meters to monitor power consumption and quality for numerous purposes, including billing, revenue, distribution, and process management. Traditionally, the primary means of measuring power consumption was an electro-mechanical power meter, while a number of other types of meters and equipment measured other parameters of power generation, distribution, usage, and quality. As technology has improved, intelligent electronic devices (IEDs), such as digital power and energy meters, Programmable Logic Controllers (PLCs), electronically-controlled Remote Terminal Units (RTUs), protective relays, fault recorders, and the like, have slowly replaced their electro-mechanical and analog counterparts.

The shift to IEDs from analog and electro-mechanical devices provides a vast array of advantages including improvements in measurement accuracy (e.g., voltage, current, power consumption, power quality, etc.) and system control (e.g., allowing a meter to trip a relay or circuit breaker). However, as a result of the increased sensitivity brought about by recent advances in technology and, in general, the shift to electronic meters from their analog counterparts, measurement accuracy tends to suffer as a result of low-amplitude and/or high-frequency noise on the signals measured.

SUMMARY OF THE DISCLOSURE

An improved intelligent electronic device, e.g., a digital electrical power and energy meter, that is less susceptible to low-amplitude and/or high frequency noise on a measured signal or parameter operates to average the measured signal or parameter over a number of consecutive cycles of the measured signal or measured parameter to produce an averaged signal, which minimizes the effect on measurement accuracy of the noise in any particular cycle of the signal. In one embodiment, a digital electrical power and energy meter includes a metering module that detects one or more parameters of an AC electrical service. Moreover, the digital electrical power and energy meter includes a processing module that processes data obtained using the metering module, wherein the processing module combines (e.g., averages) a plurality of values of at least one of the one or more parameters from a number of cycles (e.g., consecutive or non-consecutive cycles) of the AC signal. If desired, the processing module may process a first value, $x_1$, of at least one parameter, the first value obtained at a time, $t_1$, of a first AC cycle having a period p and may process one or more additional values, $x_2$ through $x_i$, of the at least one parameter, each of the one or more additional values obtained at a time $t=t_1+(n \times p)$, corresponding to one or more later AC cycles having the period p, wherein i is a pre-determined number and n is a number between 1 and i.

Figure 1:
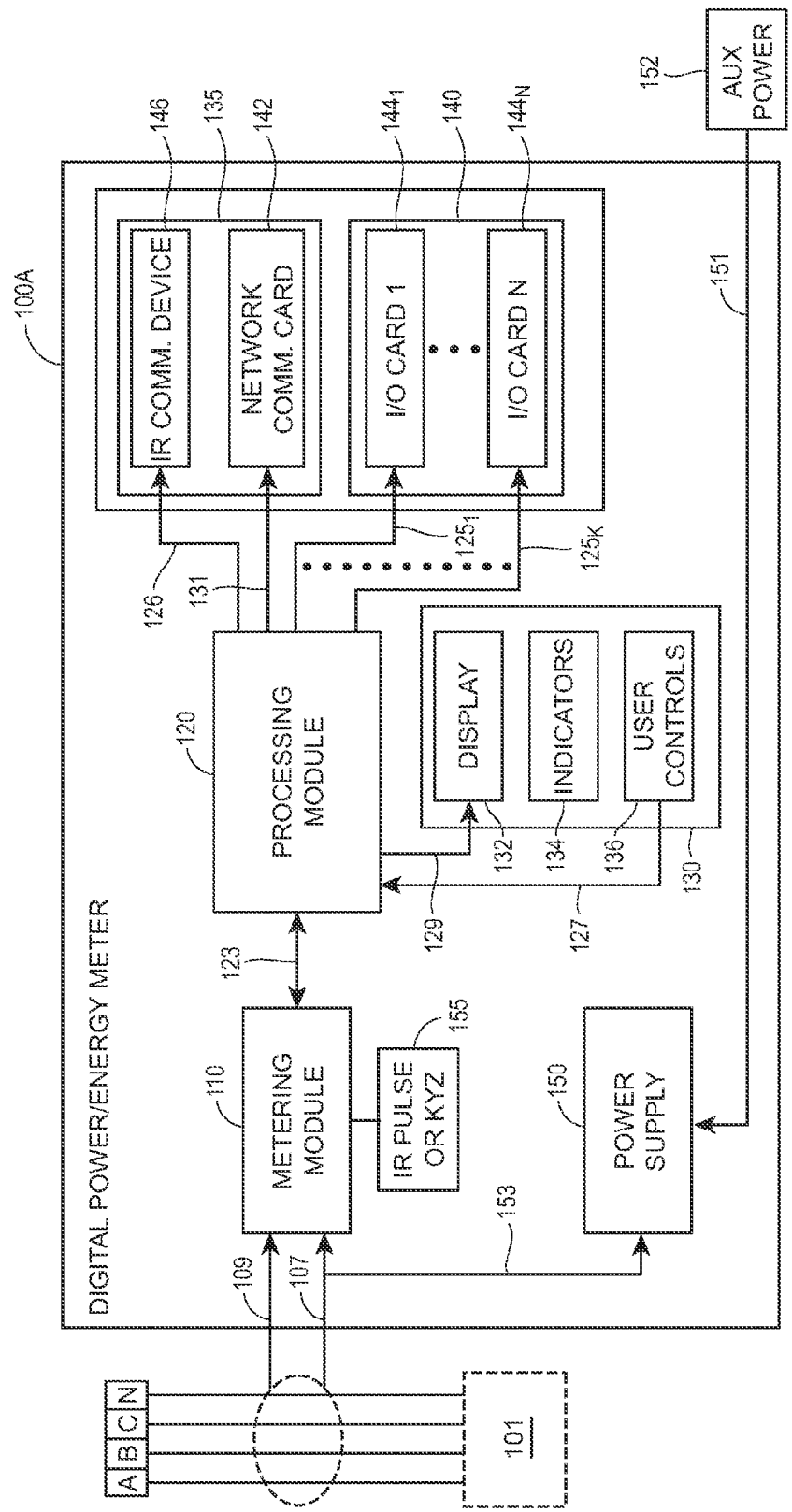
FIG. 1 is a block diagram of an exemplary digital electrical power and energy meter.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. It is contemplated that features or steps of one embodiment may beneficially be incorporated in other embodiments without further recitation.

DETAILED DESCRIPTION

While the figures and description herein are specifically directed to digital electrical power and energy meters, the concepts disclosed herein may also be applied in the context of other types of Intelligent Electronic Devices (IEDs) including, for example, Programmable Logic Controllers (PLCs), Remote Terminal Units (RTUs), protective relays, fault recorders, and other devices or systems used to quantify, manage, and control quality, distribution, and consumption of electrical power. Thus, as used herein, the term "digital electrical power and energy meter" refers broadly to any IED adapted to record, measure, communicate, or act in response to one or more parameters of an electrical service. These parameters may include, for example, supply currents and supply voltages, their waveforms, harmonics, transients, and other disturbances, and other corresponding parameters, such as power, power quality, energy, revenue, and the like. Moreover, a variety of electrical service environments may employ IEDs and, in particular, may employ digital electrical power and energy meters. By way of example and not limitation, these environments include power generation facilities (e.g., hydroelectric plants, nuclear power plants, etc.), power distribution networks and facilities, industrial process environments (e.g., factories, refineries, etc.), and backup generation facilities (e.g., backup generators for a hospital, a factory, etc.).

FIG. 1 depicts a block diagram of an exemplary digital meter 100, which generally includes a plurality of distinct modules, with each module having a dedicated task. The modules, collectively, are housed in a meter housing 100A. In particular, a metering module 110 includes voltage and current sensing circuitry and, in one embodiment, measures or calculates one or more parameters associated with an electrical load or service 101 (e.g., voltage, current, energy, etc.). The metering module 110 is coupled to the electrical service 101 to be measured and/or monitored. While the electrical service 101 is illustrated in FIG. 1 as a three-phase electrical service, the service 101 could provide other types of electrical service as well or instead. In the embodiment of FIG. 1, a current interface 107 and a voltage interface 109 couple the meter 100 to supply lines 103 A, B, C, and N of the three-phase electrical service 101. As used herein, the term "coupled" is defined to mean directly connected to or indirectly connected to through one or more intermediate components. Such intermediate components may include both hardware and software based components.

A processing module 120 within the meter 100 facilitates operation and administration of the meter 100 and processes data obtained from the metering module 110 via an interface 123. A user interface module 130 includes a user display 132 that displays results of measurements and calculations and allows configuration of the meter 100. The user interface module 130 also includes a plurality of indicators 134 and a plurality of user controls 136 which will be described in more detail below. Additionally, the user interface module 130 may include an energy pulse such as an infra-red or KYZ pulse 155. The infra-red or KYZ pulse 155 is coupled to the metering module 110, and provides an indication of energy consumption by outputting a pulse in proportion to accumulated energy consumption. An interface 129 couples the user display 132 to the processing module 120, while an interface 127 couples the user controls 136 to the processing module 120. Moreover, a communications module 135 includes a network communication card 142 and an infra-red (IR) communication device 146 and operates to facilitate communication of data to one or more external devices (not shown). The communication module 135 operates to couple the meter 100 to one or more remote terminals (not shown), and/or allows remote configuration of the meter 100. As illustrated in FIG. 1, the infrared communication device 146 (and related circuitry) is coupled to the processing module 120 by an interface 126, and the network communication card 142 is coupled to the processing module 120 by an interface 131. An I/O module 140 may also include one or more input/output (I/O) cards 144 coupled to the processing module 120 by an interface 125. A power supply 150 provides power to the various components and modules of the meter 100.

While some of the metering module 110, the processing module 120, and the power supply 150 may be required for meter operation, other modules in the illustrated embodiment are optional and may be omitted or replaced with different modules. Each of the modules 110, 130, 135, 140, and 150 is coupled to the processing module 120 and the power supply 150 is coupled to each of the modules 110, 120, 130, 135, and 140. Typically, the power supply 150 is operatively connected to the other modules of the meter 100 via a plurality of traces in the printed circuit boards (PCBs) within the meter 100. The power supply 150 is also communicatively coupled to a source of power. For example, the power supply 150 may be coupled to an external or auxiliary power source 152 via a connection 151. Alternatively, the power supply 150 may be coupled directly to the electrical service 101 via a connection 153 and obtain the source of power from the electrical service 101.

Figure 2:
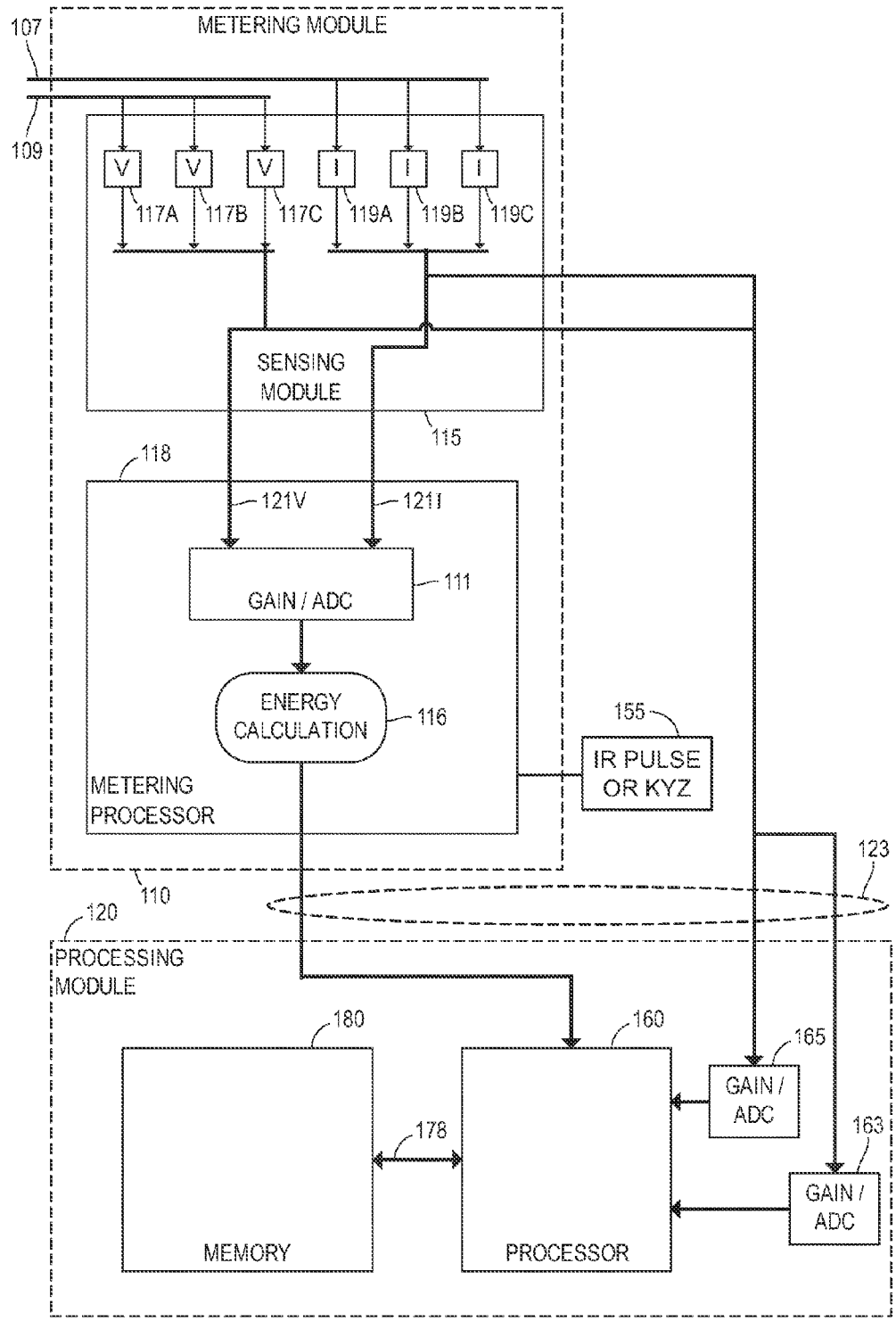
FIG. 2 is a block diagram of the metering module and processing module of the exemplary digital electrical power and energy meter of FIG. 1.

Referring now to FIG. 2, the metering module 110 may include a sensing module 115 that senses the currents and voltages on the interfaces 107 and 109, respectively, and that generates, for each sensed current or voltage, a signal representative thereof. The sensing module 115 includes voltage sensing circuitry 117 connected to the voltage interface 109, and current sensing circuitry 119 connected to the current interface 107. In the depicted embodiment, the metering module 110 also includes circuitry 111 that applies a gain factor to each of the voltage and current signals, and that converts the analog signal representative of the sensed current or voltage to a digital signal using, for example, an analog-to-digital converter (ADC). A metering processor 118 calculates one or more parameters of the electrical service 101 and, in particular, the metering processor 118 of FIG. 2 calculates energy usage.

As illustrated in FIG. 2, the interface 123, which communicatively couples the metering module 110 to the processing module 120, may include one or more buses connecting, for example, the metering processor 118 and the sensing module 115 to the processing module 120. In the illustrated embodiment, the interface 123 includes two analog signal paths disposed between the sensing module 115 and the processing module 120, and one or more digital data paths (e.g., address and data buses, a serial peripheral interface, etc.) disposed between the metering processor 118 and the processing module 120. The analog signal paths comprise additional analog channels for distributing analog signals representative of the sensed current and the sensed voltage to the processing module 120 (e.g., for waveform capture or calculating total harmonic distortion). Additional interfaces (not shown) may communicatively couple the processing module 120 to the user interface module 130 and the communications module 135 and/or the I/O modules 140. The interfaces may be any appropriate type of physical interface, and may be any appropriate logical interface. For example, where each module resides on a separate printed circuit board (PCB), the physical interface may comprise cables, header/receptacle connectors, card-edge connectors, or stackable connectors. Likewise, the logical interface may comprise a serial peripheral interface (SPI), parallel data/address buses, serial buses, or other type of electrical communication medium. Further, multiple modules may reside on a single PCB, allowing the modules to be connected via connections embedded in the PCB. Additionally, the modules illustrated in FIGS. 1 and 2 need not be physically distinct from one another, nor need the modules be physically segregated.

In the embodiment depicted in FIG. 2, the processing module 120, includes at least one processor 160 (e.g., a microprocessor, a digital signal processor (DSP), etc.) and a memory module 180 having one or more computer-readable storage devices (e.g., memories). An interface 178, which connects the processing module 120 to the memory module 180, may be any known interface compatible both with the particular memory device or devices 180 employed and with the particular processor 160. The processing module 120 may also include additional elements, such as a real-time clock (not shown), a backup power source (e.g., a battery) (not shown), and various other support circuitry (not shown). The processing module may also include one or more processors, a field programmable gate array, state machines, digital signal processors, discrete logic, other types of logic or intelligent, or any combination thereof.

The processor 160 may additionally include circuitry 163 and 165 for implementing gain control on the additional voltage and current signal channels coming from the sensing module 115 as part of the interface 123 and converting the analog signals representative of the sensed currents and voltages to digital signals (e.g., using one or more ADCs). The processor 160 may use the additional channels, each of which includes a voltage signal and a current signal for each phase of the electrical service 101, and the corresponding circuitry 163 and 165 for metering tasks that require different gain factors than the gain factors used in the energy metering functions executed on the metering module 110 to fully utilize the dynamic range of the corresponding ADC. In particular, the processor 160 may use one additional signal channel to provide waveform capture functionality. In contrast to calculating energy consumption (or generation), waveform capture must have a much larger dynamic range to capture transients such as voltage spikes (which may exceed the nominal voltage of the system by orders of magnitude). The processor 160 may use another additional voltage signal channel and current signal channel for calculating harmonic effects in the electrical service, as capturing this information requires yet a different dynamic range, and thus a different gain setting and/or different filtering.

Monitored signals, such as voltage and current, and parameters (e.g., power) calculated from the monitored signals, are subject to errors due to noise on the signals. Noise may be the result of various phenomena, including the equipment or other loads on the electrical service 101, power generation equipment, nearby electromagnetic radiation, or even components (such as the power supply 150) within the meter 100. Of course, this signal noise may decrease the accuracy of measurements and calculations of the various parameters monitored and calculated by the meter 100. Taking an average of the signal over several cycles is one way to mitigate the effects of the signal noise on the parameter measurements.

Figure 3:
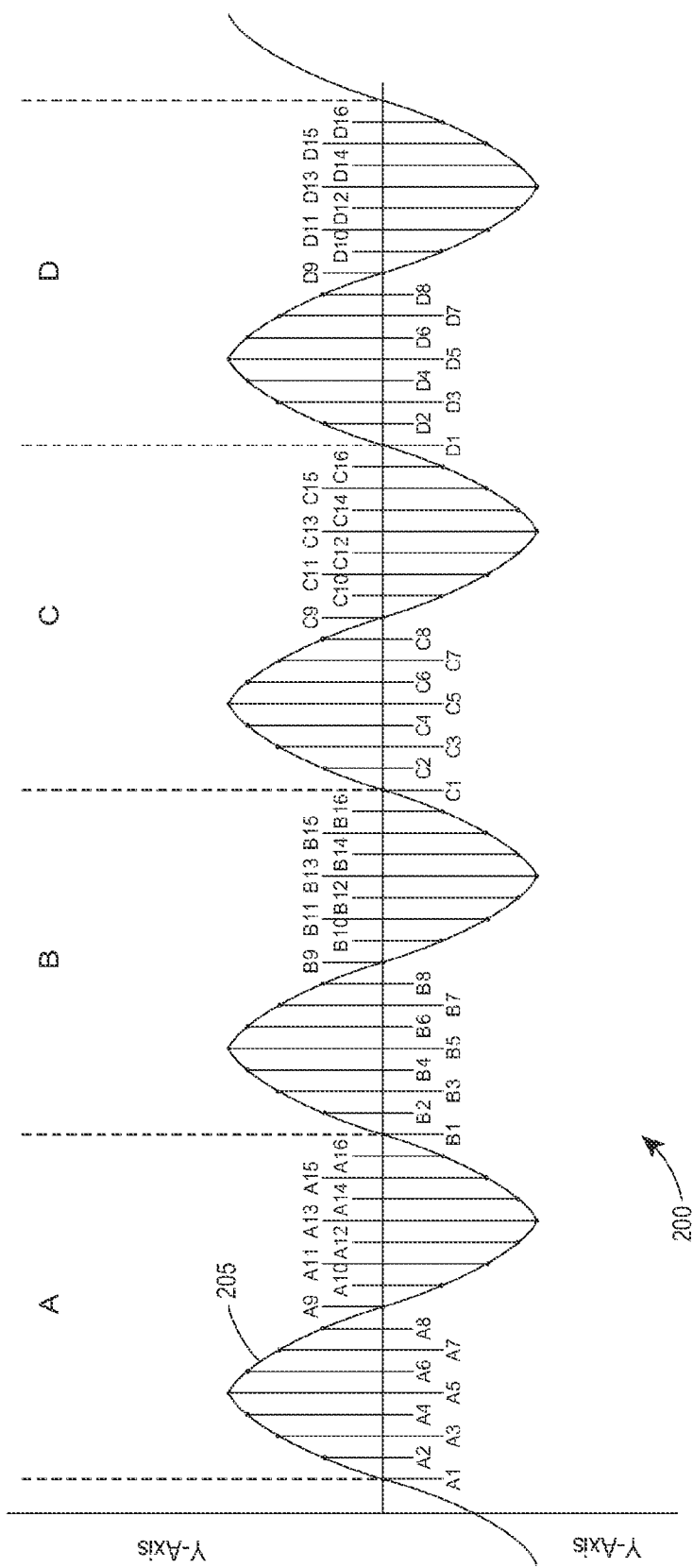
FIG. 3 is an exemplary waveform illustrating sampling of a signal.

One embodiment uses multi-cycle averaging to negate the effects of noise on the voltage and current signals when calculating total harmonic distortion (THD). The meter 100 calculates THD using the voltage and current signals of one of the analog channels between the sensing module 115 and the processor 160 and present on the interface 123 (i.e., one of the channels to the Gain/ADC circuitry 163 or 165). Each of the current and voltage signals is input into one or more ADCs in the circuitry 163 (or the circuitry 165). The ADCs sample the signals at a known frequency, thereby converting the analog signals into a series of measurements, represented by digital values. FIG. 3 illustrates a graphical depiction 200 of a representative sinusoidal signal 205. The signal 205 includes four cycles A, B, C, and D of the monitored parameter. The ADC in the circuitry 163 (or 165) samples the signal 205 wherein each sample in the depiction 200 of the signal 205 is indicated by a sample identifier A1-A16, B1-B16, C1-C16, or D1-D16. Thus, the sampling rate depicted in FIG. 3 is 16 samples/cycle. Of course, the sampling rates may be significantly higher than 16 samples/cycle. For example, one embodiment employs a sampling rate of 256 samples/cycle.

Figure 4:
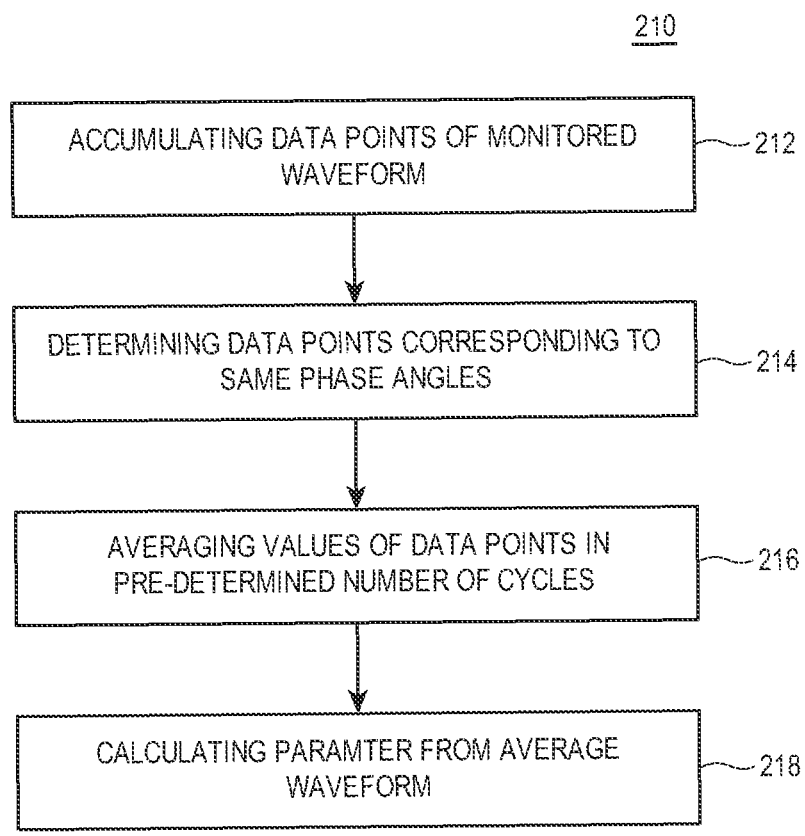
FIG. 4 is a flow chart illustrating a method of averaging a plurality of waveforms.

FIG. 4 illustrates a method 210 for averaging multiple cycles of a cyclical, time-varying parameter having a noise component and that may be used to mitigate the effects of the noise component on calculations and measurements of the signal. In a first step 212, the meter 100 accumulates data points of the monitored waveform 205 (e.g., via the gain/ADC channel of the circuitry 163). In one embodiment, the meter 100 accumulates all of the necessary data points prior to execution of subsequent steps, though this may not always be necessary. Thus, if the meter 100 is averaging the signal 205 over 4 cycles (at 16 samples/cycle, as shown in FIG. 3), 64 samples would be accumulated in the step 212. If desired, the sampled waveform may be a magnitude value or a root mean square value of any of a line voltage, a line current, a phase voltage, and a phase current. Likewise, if desired, the sampled waveform may be an energy, a revenue, a real power, a reactive power, a total power and/or a power factor or any other desired waveform.

In a step 214, the processor 160 (or other processor, such as the metering processor 118) determines the samples from different cycles but corresponding to the same phase angles of the time-varying signal 205. For example, in FIG. 3, the samples A2, B2, C2, and D2 each correspond to the same phase angle of the signal 205. Those of ordinary skill in the art will be familiar with many ways that the step 214 may be accomplished. For example, in one embodiment, the processor 160, which has, as an input, a clock signal with a significantly shorter period than the signal 205, counts the number of clock cycles that occur from some defined point in the cycle of signal 205. For example, the processor 160 may determine a zero-crossing point of the signal 205 (i.e., the point at which the signal changes from a positive value to a negative value, or vise versa). In such a circumstance, a signal with a steady frequency that is significantly lower than the frequency of the clock input to the processor 160, will nominally be at a certain phase angle after a given number of clock cycles has elapsed following a positive-to-negative transition. In another embodiment, the processor 160 may rely on a signal or value generated in another module or functional area of the meter 100 (e.g., a signal from the metering processor 118) to determine samples from multiple cycles that correspond to the same phase angle. In yet another embodiment, the processor 160 may determine a phase locking point of the signal 205.

The processor 160 performs step 214 for some number M of the samples accumulated for each cycle, depending on the required resolution of the signal and the required accuracy of the measurements or calculations. For example, in FIG. 3, each accumulated sample in one cycle may be correlated with a corresponding sample from each of the other cycles (e.g., A1, B1, C1, D1; A2, B2, C2, D2; . . . ; A16, B16, C16, D16). In one embodiment, each cycle of the signal 205 is sampled at a rate of 256 samples/cycle, and each of the 256 corresponding phase angles is included in the average.

In a step 216, the processor 160 averages, for a pre-determined number of consecutive cycles (or, alternatively for a pre-determined time interval), the values of the correlated samples determined in the step 214. If, for example, the pre-determined number of consecutive cycles over which the M samples in each cycle are averaged is N cycles, the processor 160 calculates the average for each set of N samples (one set for each of the M samples taken per cycle) having the same phase angle. This calculation may be expressed as:

$$AVG_X = \frac{(S_{N_X} + S_{N-1_X} + S_{N-2_X} + \ldots + S_{1_X})}{N}$$

where X is a number between 1 and M corresponding to a sample at a given phase angle, $AVG_X$ is the average of values corresponding to phase angle X across N cycles, and S is a value between 1 and N indicative of the cycle from which the value was measured (e.g., $S_1$ is a sample from the first cycle, $S_2$ is a sample from the second cycle with a similar phase angle as the sample from the first cycle, and so on to the sample from the Nth cycle, $S_N$). Of course, the step 216 yields a set of values $AVG_1$ through $AVG_M$, each of which is a value defining the average over N cycles of the signal 205 at a particular phase angle. The accumulation of the values $AVG_1$ through $AVG_M$ represents a single-cycle waveform that is the average of the N cycles. For example, this process, when applied to the signal 205 of FIG. 3 would yield 16 data points, calculated using the following expressions:

$$AVG_1 = \frac{(S_{4_1} + S_{3_1} + S_{2_1} + S_{1_1})}{4}$$

...

$$AVG_{16} = \frac{(S_{4_{16}} + S_{3_{16}} + S_{2_{16}} + S_{1_{16}})}{4}$$

where $S_{4_1}$ is the value of the first sample of the fourth cycle, $S_{3_1}$ is the value of the first sample of the third cycle, $S_{4_2}$ is the value of the second sample of the fourth cycle, and so on. While this discussion assumes that the various cycles from which the data is collected for producing an average waveform are consecutive cycles, non-consecutive cycles could be used instead. For example, data could be collected from every other cycle, every third cycle, every fourth cycle etc. in the manner discussed above, and this data could be averaged together to produce an average waveform.

In a step 218, the averages determined by the step 216 (i.e., $AVG_1$-$AVG_{16}$) are used to calculate a parameter. For example, in the preferred embodiment, the step 218 calculates the Total Harmonic Distortion (THD) of the signal by performing a fast Fourier transform (FFT), utilizing the average values of the sampled waveform. Of course, other parameters could be calculated as well as or instead of using the average waveform. For example, the calculated parameters may be a magnitude value or a root mean square value of any of a line voltage, a line current, a phase voltage, and a phase current. Likewise, if desired, the calculated parameter may be a real power, a reactive power, a total power and/or a power factor or any other desired parameter.

Of course, it is not required that every sample be included in the averaging process. For example, one embodiment may collect data over eight consecutive cycles, using a sampling rate of 256 samples/cycle and thereby collect 2048 samples (256 samples/cycle over 8 cycles). However, the average values for the eight consecutive cycles may be computed using only every eighth sample of each cycle. Thus, in this embodiment, while the signal is sampled 2048 times, only 256 of the 2048 samples are used in the average (e.g., samples 1, 8, 16, ... 256 of each cycle, for each of the eight cycles). The end result is a waveform comprising 32 points (e.g., $AVG_1$, $AVG_8$, $AVG_{16}$, ..., $AVG_{256}$) that represents the average waveform of the 8 cycles. The averaging process may be repeated for each channel (e.g., each current phase and each voltage phase) if so desired. Naturally, the resolution of the average waveform (i.e., the waveform formed from the calculated average values) may be varied by using more of the samples (e.g., using every fourth sample instead of every eighth sample per cycle) and/or sampling at a higher frequency (e.g., sampling at 2048 samples/cycle instead of 256 samples/cycle).

The method described above, while applicable to a variety of parameters (e.g., current, voltage, energy, real power, etc.), is particularly useful in calculating the Total Harmonic Distortion of a signal by performing a fast Fourier transform (FFT), utilizing the average values of the sampled waveform. This is true because the THD is a relatively static parameter, and noise on the signal or signals is likely spurious in nature or introduced in the analog-to-digital converter. Thus, by removing the noise using the method described above (or another averaging method), the calculated THD more accurately reflects THD of the signals on the electrical service 101.

Figure 5:
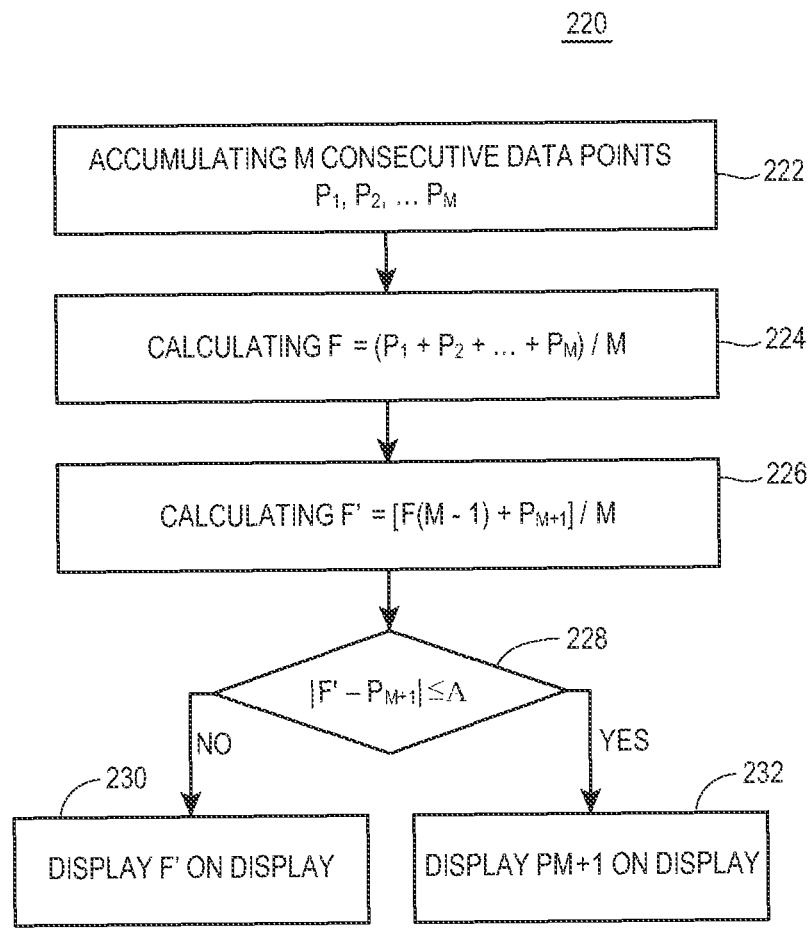
FIG. 5 is a flow chart illustrating a method of filtering a series of values of a parameter.
Figure 6:
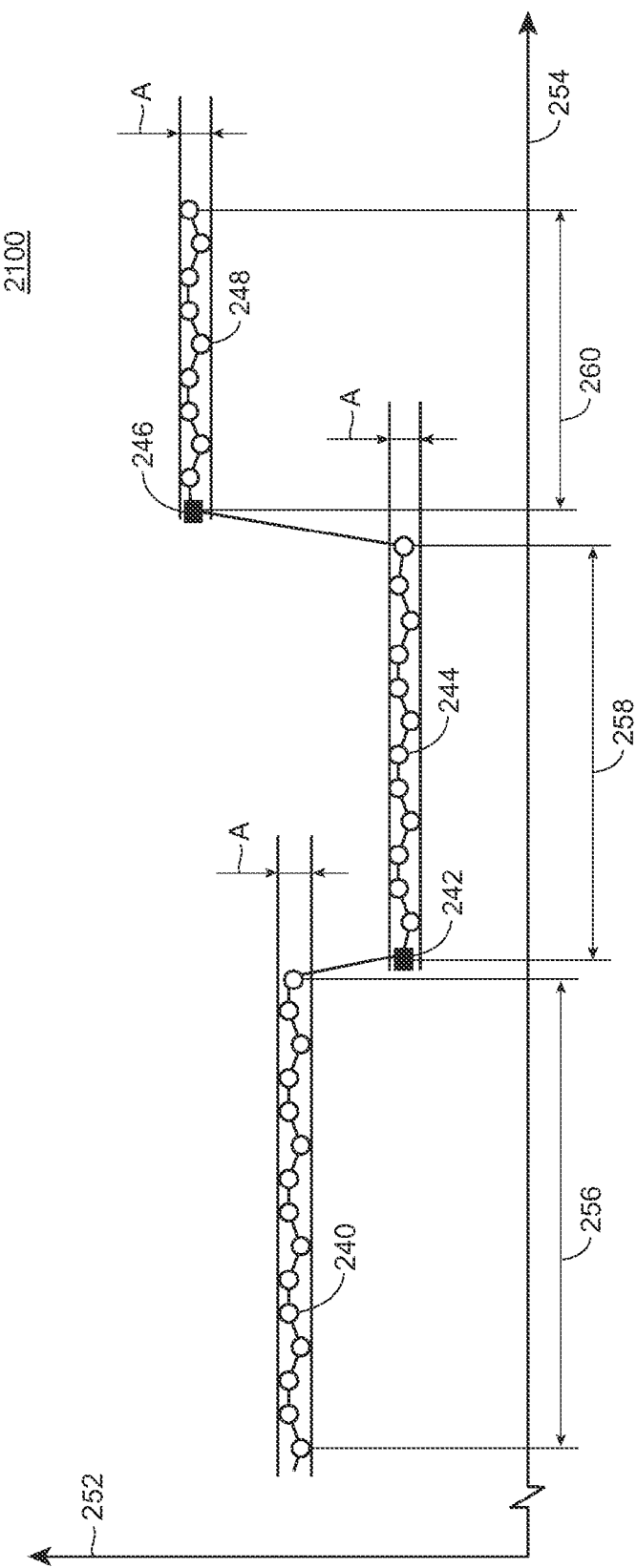
FIG. 6 is an exemplary waveform illustrating the method of FIG. 5.

While the method 210 uses averages to mitigate the effects of noise on the calculation of a parameter monitored by the meter 100, the meter 100 may also employ a method 220, illustrated in FIG. 5, to eliminate the effects of noise on a parameter being displayed on the display 132. In particular, a monitored or calculated parameter displayed on the display 132 may, due to slight variations in the value of the parameter caused by noise, cause the display 132 to display a different value of the parameter with each update of the display 132. For example, FIG. 6 depicts a series of data points 240, 242, 244, 246, 248, each data point representative of a magnitude or value (shown on the y-axis 252) of an arbitrary parameter P (e.g., supply voltage, supply current, energy, etc.) as a function of time (shown on the x-axis 254). The parameter P has a noise component that causes the measurements thereof to vary within an envelope A.

The method 220 of FIG. 5 employs a weighted average of the measured values of the parameter P to mitigate the effects of the noise on the value displayed by the meter 100. In a first step 222, the meter 100 and, in particular, the processor 160 (or the processor 118) accumulates a series of M consecutive values of the parameter P (i.e., $P_1, P_2, \ldots, P_M$), where M is a pre-determined number. The number M of consecutive values of the parameter P collected (i.e., the weight of the average) may be set by a user of the meter 100 according to whether the user desires to view a relatively more steady value displayed for the parameter P, or a relatively more dynamic value displayed for the parameter P. Alternatively, the value of M may be pre-set in the factory and be unalterable by the user. As will be clear from the description below, the greater the value of M, the steadier the displayed value of P. Of course, the number M of consecutive cycles collected may be different for different parameters, according to typical characteristics of the particular parameter or the desires of a user.

Having collected M consecutive values of parameter P in step 222, the processor 160 calculates the average F of the M values of parameter P in step 224. While there are a variety of averaging techniques that could be implemented by the method 220 or similar methods, the averaging technique employed by the method 220 may be expressed as:

$$F = \frac{(P_1 + P_2 + \ldots + P_M)}{M}$$

Upon receiving the next consecutive value of the parameter P (i.e., $P_{M+1}$), the processor 160 may calculate a weighted average F' in a step 226, using the equation:

$$F' = \frac{F(M-1) + P_{M+1}}{M}$$

In a step 228, the processor 160 calculates the absolute value of the difference between the weighted average F' and the value of the last consecutive measurement of parameter P (i.e., $P_{M+1}$), and compares this difference to a pre-determined value A. This computation may be expressed as:

$$|F' - P_{M+1}| \leq A$$

If the equation above evaluates to be true (e.g., if the magnitude of the difference is less than the threshold A), a step 232 displays the value F'. The time intervals 256, 258, and 260 of FIG. 6 illustrate time intervals during which control would pass to the step 232. If the equation above evaluates to false (e.g., if the magnitude of the difference is greater than the threshold A), a step 230 displays the value of $P_{M+1}$ on display 132. Data points 242 and 246 illustrate points at which control would pass to the step 230.

A user of, or, in the one embodiment, the manufacturer of the meter 100 sets the pre-determined threshold value A according to the type and characteristics of the signal to which the method 220 is being applied, and according to the type and likelihood of noise on the affected signal. For example, when determining the threshold value A for a signal or parameter for which relatively small changes in the value of the parameter are indicative of more than simple noise, A should be set to a relatively smaller number. By contrast, when determining the threshold value A for a signal or parameter for which noise is likely to be of a higher amplitude, the predetermined value A should be set to a relatively larger number, such that transient noise does not adversely affect the measurements related to the signal or parameter. Of course, the value A may be different for each parameter or signal, and may vary even on a single signal according to, for example, the scaling of the measurement.

Although the disclosure herein has been described with reference to particular illustrative embodiments, it is to be understood that these embodiments are merely illustrative of the principles and applications of the present disclosure. Therefore, numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning Finally, unless a claim element is defined by reciting the word "means" and a function without the recital of any structure, it is not intended that the scope of any claim element be interpreted based on the application of 35 U.S.C. §112, sixth paragraph.

What is claimed is:

1. A method of displaying a parameter of an alternating current (AC) electrical service on a metering device, wherein the parameter has a noise component, the method comprising:
sensing a parameter of an alternating current (AC) electrical service using a metering module of metering device,
accumulating a predetermined number of consecutives values of the parameter;
calculating an average value of the parameter from the predetermined number of consecutives values;
calculating a weighted average value of the parameter based on the calculated average value and a next consecutive value of the parameter;
determining an absolute value of a difference between the weighted average value and the next consecutive value of the parameter; and
if the absolute value is less than a predetermined threshold, displaying the weighted average value of the parameter.

2. The method of claim 1, wherein if the absolute value is greater than the predetermined threshold, displaying the next consecutive value of the parameter.

3. The method of claim 2, wherein the predetermined number of consecutives values of the parameter is adjustable.

4. The method of claim 3, wherein the greater the predetermined number of consecutives values of the parameter, the steadier the displayed value of the parameter.

5. The method according to claim 2, wherein the parameter is selected from the group consisting of: a value or a root mean square value of any one of: a line voltage, a line current, a phase voltage, and a phase current; a total harmonic distortion; energy; revenue; real power; reactive power; total power; and a power factor.

6. The method of claim 5, wherein the predetermined number of consecutives values of the parameter is different for each particular parameter.

7. The method of claim 5, wherein the predetermined threshold is different for each particular parameter.

8. The method of claim 2, wherein the predetermined threshold is adjustable.

9. The method of claim 2, wherein the predetermined threshold is approximately equal to an amplitude of the noise component.

10. The method of claim 2, wherein the weighted average value is determined using the equation:

$$F' = \frac{F(M-1) + P_{M+1}}{M}$$

wherein F' is the weighted average value, F is the calculated average, M is the predetermined number of consecutives values and $P_{M+1}$ is the next consecutive value of the parameter.

11. An intelligent electronic device comprising:
a metering module that obtains values of a parameter of an alternating current (AC) electrical service an AC signal delivered by the AC electrical service;
a processing module that processes the values obtained by the metering module; and
a display module that displays the values of the parameter,
wherein the processing module is operative to accumulate a predetermined number of consecutives values of the parameter, calculate an average value of the parameter from the predetermined number of consecutives values, calculate a weighted average value of the parameter based on the calculated average value and a next consecutive value of the parameter, determine an absolute value of a difference between the weighted average value and the next consecutive value of the parameter, and if the absolute value is less than a predetermined threshold, display the weighted average value of the parameter on the display module.

12. The intelligent electronic device of claim 11, wherein if the absolute value is greater than the predetermined threshold, the display module displays the next consecutive value of the parameter.

13. The intelligent electronic device of claim 12, further comprising a user interface module configured for adjusting the predetermined number of consecutives values.

14. The intelligent electronic device of claim 13, wherein the greater the predetermined number of consecutives values of the parameter, the steadier the displayed value of the parameter.

15. The intelligent electronic device of claim 12, wherein the parameter is selected from the group consisting of: a value or a root mean square value of any one of: a line voltage, a line current, a phase voltage, and a phase current; a total harmonic distortion; energy; revenue; real power; reactive power; total power; and a power factor.

16. The intelligent electronic device of claim 15, wherein the predetermined number of consecutives values of the parameter is different for each particular parameter.

17. The intelligent electronic device of claim 15, wherein the predetermined threshold is different for each particular parameter.

18. The intelligent electronic device of claim 12, further comprising a user interface module configured for adjusting the predetermined threshold.

19. The intelligent electronic device of claim 12, wherein the predetermined threshold is approximately equal to an amplitude of the noise component.

20. The intelligent electronic device of claim 12, wherein the weighted average value is determined using the equation:

$$F' = \frac{F(M-1) + P_{M+1}}{M}$$

wherein F' is the weighted average value, F is the calculated average, M is the predetermined number of consecutives values and $P_{M+1}$ is the next consecutive value of the parameter.

* * * * *